(12) United States Patent
Hullinger et al.

(10) Patent No.: US 8,058,674 B2
(45) Date of Patent: Nov. 15, 2011

(54) ALTERNATE 4-TERMINAL JFET GEOMETRY TO REDUCE GATE TO SOURCE CAPACITANCE

(75) Inventors: Derek Hullinger, Orem, UT (US); Keith Decker, Pleasant Grove, UT (US)

(73) Assignee: Moxtek, Inc., Orem, UT (US)

( * ) Notice: Subject to any disclaimer, the term of this patent is extended or adjusted under 35 U.S.C. 154(b) by 290 days.

(21) Appl. No.: 12/574,827

(22) Filed: Oct. 7, 2009

(65) Prior Publication Data

US 2011/0079824 A1   Apr. 7, 2011

(51) Int. Cl.
  *H01L 29/80*   (2006.01)
  *H01L 31/112*   (2006.01)
  *H01L 31/0288*   (2006.01)
  *H01L 29/00*   (2006.01)

(52) U.S. Cl. ........ 257/256; 257/257; 257/263; 257/277; 257/504; 257/E27.148; 257/E29.265; 257/E29.314

(58) Field of Classification Search .......... 257/256, 257/257, 263, 277, 504, E27.148, E29.265, 257/E29.314
See application file for complete search history.

(56) References Cited

U.S. PATENT DOCUMENTS

| | | | |
|---|---|---|---|
| 4,612,629 A * | 9/1986 | Harari | 365/185.08 |
| 4,855,257 A | 8/1989 | Kouda | |
| 4,876,579 A | 10/1989 | Davis et al. | |
| 6,236,100 B1 * | 5/2001 | Pernyeszi | 257/500 |
| 7,518,189 B1 * | 4/2009 | Hackler et al. | 257/347 |
| 7,525,163 B2 | 4/2009 | Vora | |
| 7,825,441 B2 * | 11/2010 | Eshun et al. | 257/285 |
| 7,977,714 B2 * | 7/2011 | Ellis-Monaghan et al. | 257/270 |
| 2005/0230715 A1 * | 10/2005 | Hoshino et al. | 257/263 |
| 2006/0046405 A1 | 3/2006 | Chen | |
| 2007/0120194 A1 * | 5/2007 | Shiraishi et al. | 257/368 |
| 2007/0284626 A1 * | 12/2007 | Vora et al. | 257/256 |
| 2008/0036009 A1 | 2/2008 | Vora | |
| 2008/0099796 A1 | 5/2008 | Vora | |
| 2008/0251818 A1 | 10/2008 | Hao et al. | |
| 2008/0272401 A1 * | 11/2008 | Vora et al. | 257/256 |
| 2009/0206375 A1 * | 8/2009 | Saha et al. | 257/281 |
| 2010/0171155 A1 * | 7/2010 | Saha | 257/256 |
| 2010/0176420 A1 * | 7/2010 | Yao | 257/187 |
| 2011/0215871 A1 * | 9/2011 | Bracale et al. | 330/277 |

FOREIGN PATENT DOCUMENTS

| | | |
|---|---|---|
| EP | 0325383 | 7/1989 |
| EP | 577497 A1 * | 1/1994 |

* cited by examiner

*Primary Examiner* — Ida M Soward
(74) *Attorney, Agent, or Firm* — Thorpe North & Western LLP

(57) ABSTRACT

A 4-Terminal JFET includes a substrate having a first conduction type and an upper layer having a second, opposite, conduction type over the substrate. A gate and a source are embedded in the upper layer. A gate pad is electrically connected to the gate. A region, which has a first conduction type, is formed in the upper layer and separates the upper layer into two sections. This region reduces the overall capacitance between the gate pad and the source. Reduced overall gate to source capacitance can result in reduced noise amplification in the JFET.

20 Claims, 3 Drawing Sheets

ALTERNATE 4-TERMINAL JFET GEOMETRY TO REDUCE GATE TO SOURCE CAPACITANCE

FIELD OF THE INVENTION

The present invention relates to Junction Field Effect Transistors (JFET).

BACKGROUND

In FIGS. 1 and 2, a four-terminal JFET 10 is shown. Four-terminal JFETs are comprised of the following terminals: a substrate 14, a gate 11c, a first channel terminal 13c, and a second channel terminal 16c. Usually, the first channel terminal 13c is the source and the second channel terminal 16c is the drain. Typically the substrate 14 and the gate 11c will be made of a first conduction type, such as p, and are usually highly doped. The source 13c and drain 16c are usually made of a second conduction type, which is opposite of the conduction type of the gate 11c, such as n, and are also highly doped. The gate 11c and source 13c are usually embedded in an upper layer 15a-c that is the same conduction type as the source 13c, such as n, but is usually not highly doped. This upper layer 15a-c is often an epitaxial layer.

A gate pad 11a, used for making an external connection to the gate 11c, may be attached to the gate through a gate trace 11b. The gate pad 11a and/or gate trace 11b may be situated over, and electrically isolated from, the source 13c. An insulating material 12, such as an oxide may be used to isolate the source 13c from the gate pad 11a and/or gate trace 11b. Similarly, a source pad 13a is connected to the source 13c via a source trace 13b, and a drain pad 16a is connected to the drain 16c via a drain trace 16b.

The upper layer 15a-c may be divided into three different sections. There may be no actual separation between the sections, but such a division may aid in description of the device. Section one 15c of the upper layer is the section that is disposed at least partly beneath the gate 11c. Section two 15a of the upper layer is the section that is disposed beneath the gate pad 11a. Section three 15b of the upper layer is the section that is disposed at least partly beneath the gate trace 11b. Section one 15c may also be disposed between the source 13c and the gate 11c, although the source 13c and the gate 11c may also touch each other with no such section between.

For optimal JFET performance, it is usually desirable to reduce the capacitance between the gate 11c and any other component because such capacitance can magnify undesirable noise in the device. The upper layer 15a-c may reduce the capacitance between the gate, gate trace, and gate pad 11a-c and the substrate 14. The insulating layer 12 may reduce the capacitance between the gate, gate trace, and gate pad 11a-c and the source 13c. Because the upper layer 15 is of the same conduction type as the source 13c, this upper layer is not very effective at reducing the capacitance between the source 13c and the gate pad 11a.

As noted by dashed lines 17a-c, there are various capacitance paths between the gate, gate trace, and gate pad 11a-c and the source 13c. One capacitance path 17c is between the gate 13c and the source 11c. A second capacitance path 17b is between the gate trace 11b and the source 13c. Another capacitance path 17a is between the gate pad 11a and the source 13c. Because sections two and three 15a and 15b of the layer are electrically connected to the source 13c and because of the large size of the gate pad 11a, the capacitance through this path is significant. The combined capacitance of these three capacitance paths has a significant effect on noise amplification of the device. It would be beneficial to reduce this capacitance.

SUMMARY OF THE INVENTION

It has been recognized that it would be advantageous to reduce the capacitance between the gate, gate trace, and gate pad and the source.

The present invention provides a reduced gate-to-source capacitance JFET device with a substrate having a first conduction type. An upper layer is disposed over the substrate and has a second, opposite, conduction type. A region having a first conduction type is formed in the upper layer such that it separates the upper layer into two sections, including section one and section two. A gate is disposed in section one of the upper layer and is separated from the substrate by the upper layer. The gate has the first conduction type. A first channel terminal, which is usually the source, is disposed in section one of the upper layer and has the second conduction type. A gate pad is disposed over section two of the upper layer and is electrically coupled to the gate, and electrically isolated from the source and the upper layer.

In accordance with a more detailed aspect of the present invention, the JFET device can be part of a radiation detection system with a radiation detector electrically attached to the JFET. An hermetically sealed container can surround the radiation detector and JFET. A widow in the container can allow x-rays to pass into the container and impinge upon the radiation detector.

DETAILED DESCRIPTION

Figure 1:
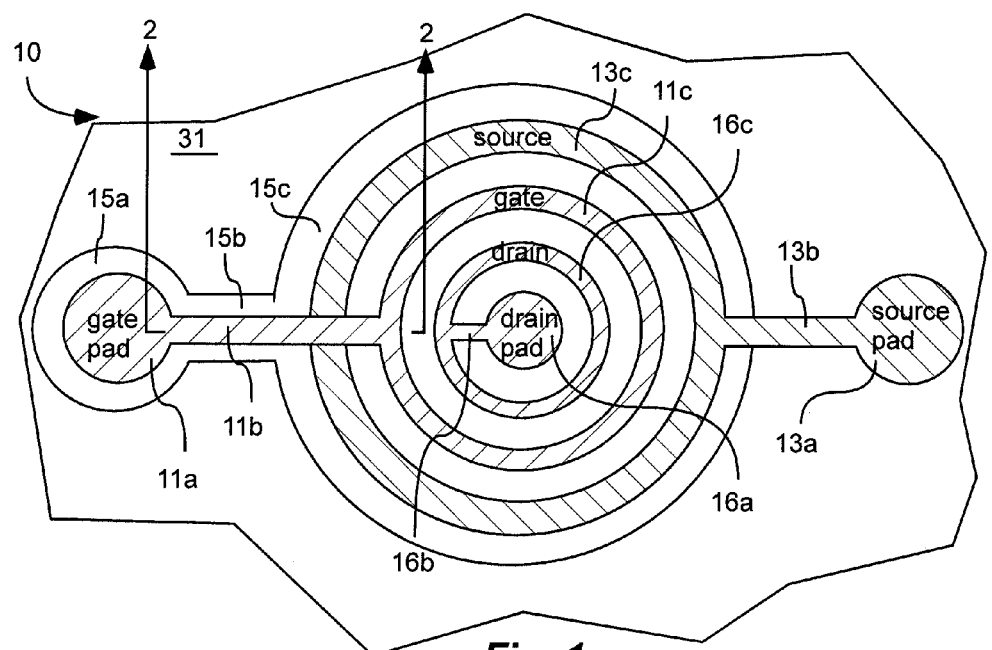
FIG. 1 is a schematic top view of a prior-art JFET.
Figure 2:
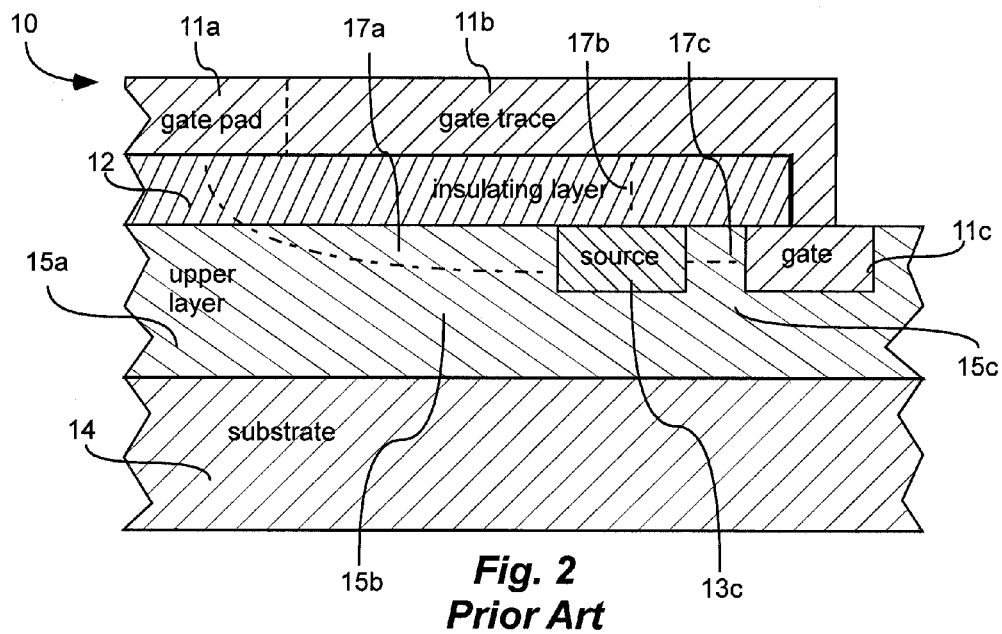
FIG. 2 is a schematic cross-sectional side view of the JFET of FIG. 1 taken along line 2-2 in FIG. 1.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

Figure 3:
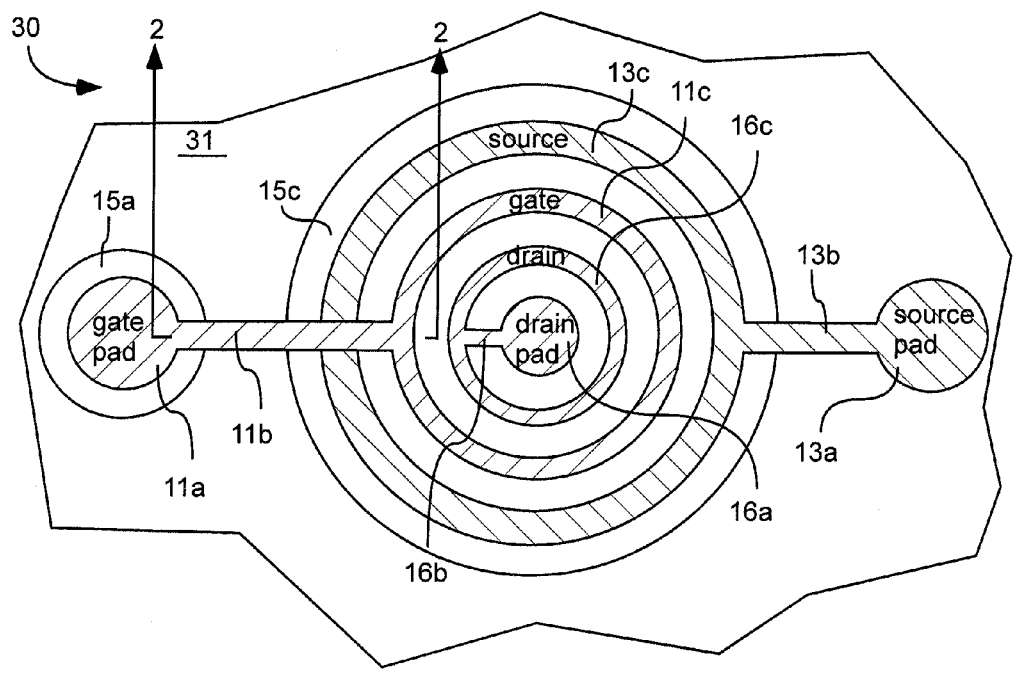
FIG. 3 is a schematic top view of a JFET in accordance with an embodiment of the present invention.
Figure 4:
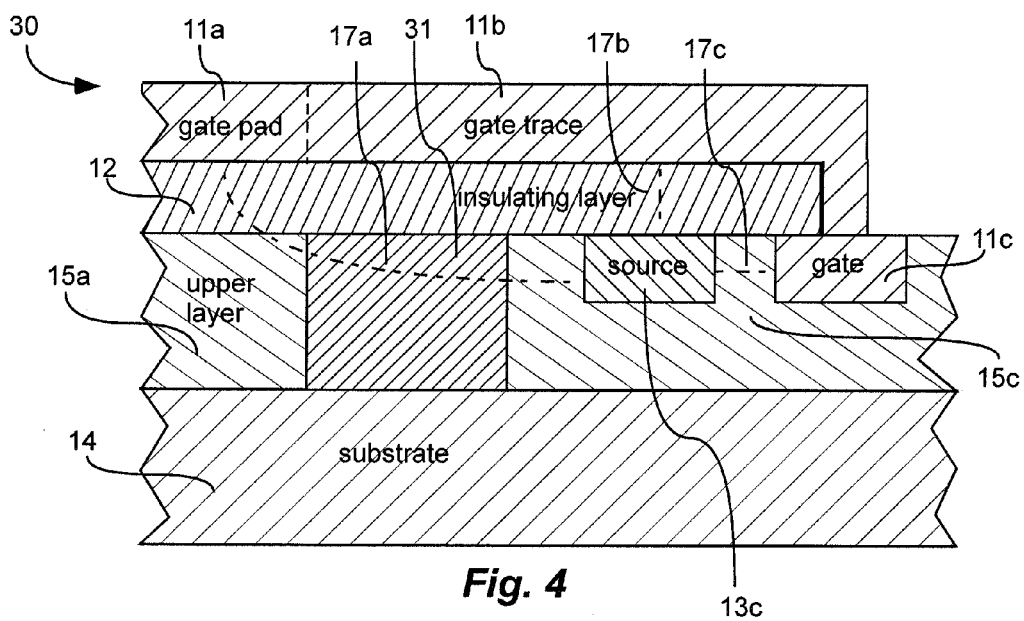
FIG. 4 is a schematic cross-sectional side view of the JFET of FIG. 3 taken along line 4-4 in FIG. 3.

A reduced capacitance, four-terminal JFET 30 is shown in FIGS. 3 and 4. The JFET 30 includes the following terminals; a substrate 14, a gate 11c, a first channel terminal 13c, and a second channel terminal 13c. Usually, the first channel terminal 13c is the source and the second channel terminal 16c is the drain. In this application, for simplicity, "source" is used to describe the first channel terminal and "drain" is used to describe the second channel terminal, but the invention is not limited to the source being the first channel terminal and the drain being the second channel terminal. The alternative configuration could be used with the drain being the first channel terminal and the source being the second channel terminal.

The substrate 14 and the gate 11c can be made of a first conduction type and can be highly doped. The source 13c can be made of a second conduction type, which is opposite of the first conduction type, and can also be highly doped. The gate 11c and source 13c can be embedded in an upper layer 15a-c that is the same conduction type as the source 13c, but is usually not highly doped. The upper layer 15a-c can be disposed over the substrate. The gate 11c can be placed in the upper layer 15 such that the upper layer 15a-c separates the gate 11c from the substrate 14. The source 13c may extend down such that it contacts the substrate 14 or the upper layer 15a-c may separate the source 13c from the substrate 14. This upper layer 15a-c can be an epitaxial layer. The first conduction type can be p, and the second conduction type n, or the first conduction type can be n, and the second conduction type can be p.

A gate pad 11a, used for making an external connection to the gate 11c, may be attached or electrically coupled to the gate through a gate trace 11b. The gate pad 11a and/or gate trace 11b may be situated over, and electrically isolated from, the source 13c. An insulating material 12, such as an oxide, may be used to isolate the source 13c from the gate pad 11a and/or gate trace 11b. Similarly, a source pad 13a is connected to the source 13c via a source trace 13b and a drain pad 16a is connected to the drain 16c via a drain trace 16b.

For optimal JFET performance, it is usually desirable to reduce the capacitance between the gate 11c and any other component because such capacitance can magnify undesirable noise in the device. The upper layer 15a-c may reduce the capacitance between the gate, gate trace, and gate pad 11a-c and the substrate 14. The insulating layer 12 may reduce the capacitance between the gate, gate trace, and gate pad 11a-c and the source 13c. Because the upper layer 15a-c is of the same conduction type as is the source 13c, this upper layer is not very effective at reducing the capacitance between the source 13c and the gate pad 11a.

As noted by dashed lines 17a-c, there are various capacitance paths between the gate, gate trace, and gate pad 11 and the source 13c. One capacitance path 17c is between the gate 13c and the source 11c. A second capacitance path 17b is between the gate trace 11b and the source 13c. Another capacitance path 17a is between the gate pad 11a and the source 13c. The combined capacitance of these three capacitance paths affects noise amplification of the device.

In order to reduce the noise amplification caused by the capacitance between the gate pad 11a and the source 13c, a region 31, having a first conduction type, is formed in the upper layer and separates the upper layer into two sections, section one 15c and section two 15a. Because the region 31 is of the first conduction type, it creates a low capacitance region between the gate pad 11a and the source 13c, resulting in reduced overall capacitance between the gate, gate trace, gate pad 11a-c and the source 13c. Because the region 31 is of the same conduction type as the substrate and the gate, it can have an undesirable effect of an increased capacitance between the gate and the substrate. To minimize such increased gate-to-substrate capacitance, the region 31 can be placed beneath the low surface area gate trace 11b and not beneath the large surface area gate pad 11a. The overall effect of such placement is a significant reduction in gate 11c to source 13c capacitance with minimal adverse effect on the gate 11c to substrate 14 capacitance. Note that if the source 13c extends down to the substrate, and region 31 is not situated adjacent to the source 13c, then section one 15c can be divided into two subsections. Region 31 may be situated adjacent to the source 13c or there may be upper layer 15c between region 31 and the source 13c. The region 31 can physically separate the upper layer, or sections one and two 15c and 15a, under the trace. The region can fill a space between the insulating layer 12 and the substrate 14.

How to Make

The reduced capacitance 4-terminal JFET can be made by standard semiconductor manufacturing processes and can be made of standard semiconductor materials such as silicon, germanium, gallium arsenide, etc. The dopants can be standard doping materials. For example, boron or boron difluoride may be used for p type doping and phosphorous or arsenic may be used for n type doping.

The region 31 between section one 15c and section two 15a of the upper layer can be formed by depositing an oxide over the entire surface of the device, then depositing a photoresist mask over the surface which allows the oxide over the region to be selectively etched away. A dopant can be diffused into the material to a sufficient depth that it makes electrical contact with the substrate. The oxide that was not etched way can prevent the dopant from diffusing into other regions.

EXEMPLARY APPLICATIONS

Figure 5:
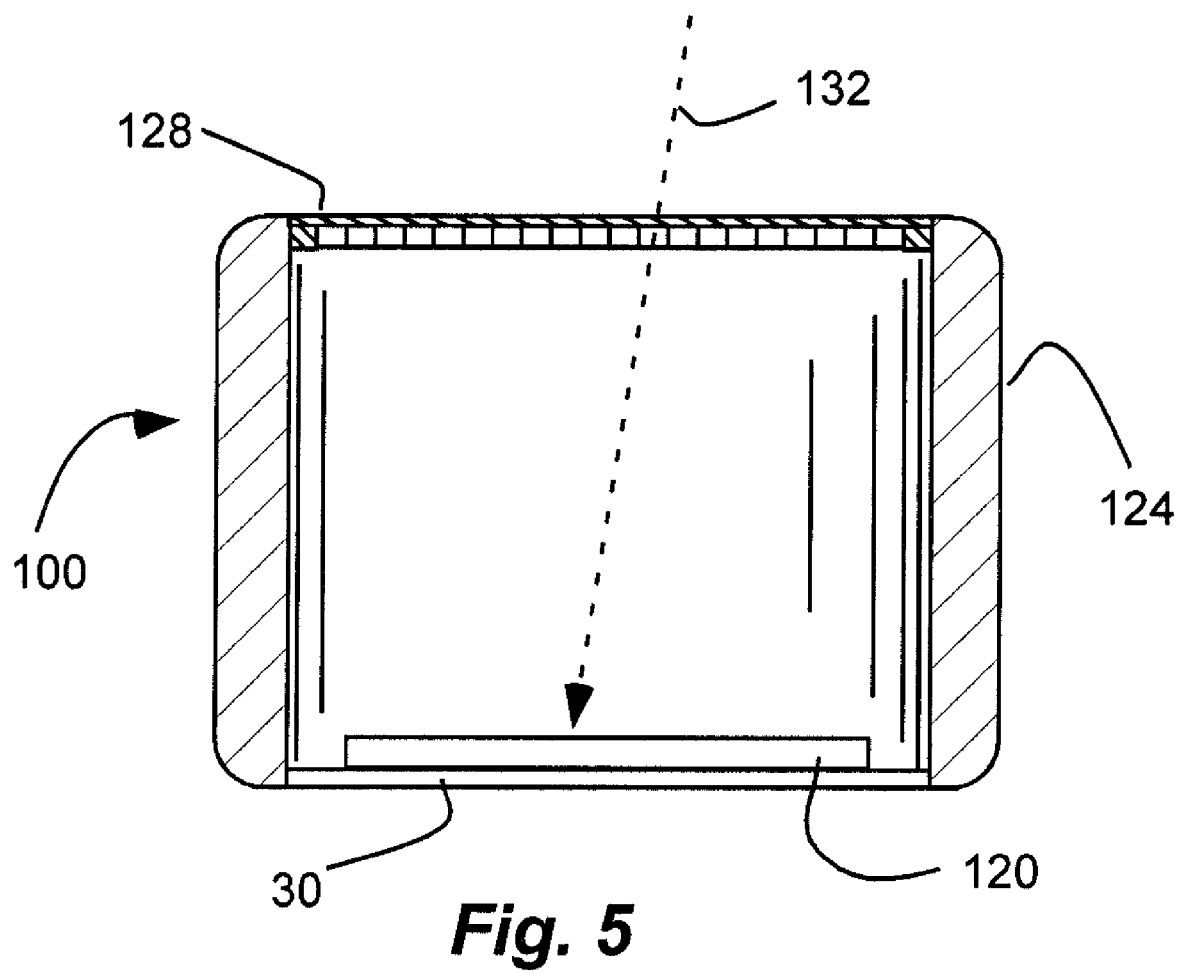
FIG. 5 is a schematic cross-sectional side view of a radiation detection system in accordance with an embodiment of the present invention utilizing the JFET of FIGS. 3 and 4.

Referring to FIG. 5, the above described reduced capacitance 4-terminal JFET 30 can be utilized with a radiation detection system 100. The radiation detection system can include a radiation detector 120 electrically attached to the JFET 30. An hermetically sealed container 124 can surround the radiation detector 120 and JFET 30. A widow 128 in the container 124 can allow x-rays, represented by line 132, to pass into the container and impinge upon the radiation detector.

It is to be understood that the above-referenced arrangements are only illustrative of the application for the principles of the present invention. Numerous modifications and alternative arrangements can be devised without departing from the spirit and scope of the present invention. While the present invention has been shown in the drawings and fully described above with particularity and detail in connection with what is presently deemed to be the most practical and preferred embodiment(s) of the invention, it will be apparent to those of ordinary skill in the art that numerous modifications can be made without departing from the principles and concepts of the invention as set forth herein.

What is claimed is:

1. A reduced gate to first channel terminal capacitance JFET device, comprising:
   a) a substrate having a first conduction type;
   b) an upper layer disposed over the substrate and having a second, opposite, conduction type;
   c) a region formed in the upper layer and separating the upper layer into two sections including section one and section two, the region having the first conduction type;
   d) a gate disposed in section one of the upper layer and separated from the substrate by the upper layer, the gate having the first conduction type;
   e) a first channel terminal disposed in section one of the upper layer and having the second conduction type; and
   f) a gate pad disposed over section two of the upper layer and electrically coupled to the gate, and electrically isolated from the first channel terminal and the upper layer.

2. A device as in claim 1, wherein the gate, the first channel terminal, and the substrate are doped.

3. A device as in claim 1, wherein the upper layer is an epitaxial layer.

4. A device as in claim 1, wherein the upper layer separates the gate from the first channel terminal.

5. A device as in claim 1, wherein the first conduction type is p and the second conduction type is n.

6. A device as in claim 1, wherein the first conduction type is n and the second conduction type is p.

7. A device as in claim 1, wherein the gate pad includes aluminum.

8. A device as in claim 1, wherein the gate is attached to the gate pad by a gate trace, and the region is disposed substantially beneath the gate trace.

9. A device as in claim 1, wherein an insulating layer is disposed between the upper layer and the gate pad.

10. A device as in claim 9, wherein the insulating layer is an oxide.

11. A reduced gate to first channel terminal capacitance JFET device, comprising:
   a) a highly doped substrate having a first conduction type;
   b) an upper layer having an opposite second conduction type and disposed over the substrate;
   c) a doped gate having the first conduction type disposed in the upper layer such that the upper layer separates the gate from the substrate;
   d) a doped first channel terminal having the second conduction type disposed in the upper layer such that the upper layer separates the first channel terminal from the gate;
   e) a gate pad disposed adjacent the first channel terminal opposite the gate and electrically coupled to the gate by a gate trace extending over at least a portion of the first channel terminal, electrically isolated from the first channel terminal and the upper layer by an insulating layer; and
   f) a region formed in the upper layer beneath the gate trace and separating the gate pad and the first channel terminal, the region having the first conduction type.

12. A device as in claim 11, wherein the upper layer is an epitaxial layer.

13. A device as in claim 11, wherein the first conduction type is p and the second conduction type is n.

14. A device as in claim 11, wherein the first conduction type is n and the second conduction type is p.

15. A device as in claim 11, wherein the gate pad includes aluminum.

16. A device as in claim 11, wherein the insulating layer is an oxide.

17. A radiation detection system, comprising:
   a) a reduced gate to first channel terminal capacitance JFET device, the JFET comprising:
      i) a substrate having a first conduction type;
      ii) an upper layer having an opposite second conduction type and disposed over the substrate;
      iii) a gate having the first conduction type disposed in the upper layer such that the upper layer separates the gate from the substrate;
      iv) a first channel terminal having the second conduction type and disposed in the upper layer such that the upper layer separates the first channel terminal from the substrate;
      v) a gate pad attached to the gate, electrically isolated from the first channel terminal and the upper layer; and
      vi) a region formed in the upper layer and separating the gate pad and the first channel terminal, the region having the first conduction type; and
   b) a radiation detector electrically attached to the JFET.

18. A system as in claim 17, further comprising:
   a) an hermetically sealed container surrounding the radiation detector and JFET; and
   b) a widow in the container configured to allow x-rays to pass into the container and impinge upon the radiation detector.

19. A reduced gate to first channel terminal capacitance JFET device, comprising:
   a) a doped substrate having a first conduction type;
   b) an upper layer having an opposite second conduction type and disposed over the substrate;
   c) the upper layer is an epitaxial layer;
   d) a region having the first conduction type disposed over the substrate and separating the upper layer into a section one and a section two;
   e) a doped gate having the first conduction type and disposed in the section one of the upper layer such that the upper layer separates the gate from the substrate;
   f) a doped first channel terminal having the second conduction type disposed in the section one of the upper layer such that the upper layer separates the first channel terminal from the substrate and the first channel terminal from the gate;
   g) a gate pad attached to the gate by a gate trace, electrically isolated from the first channel terminal and the upper layer by an oxide insulating layer, and disposed at least partially over the section two; and
   h) the region disposed substantially beneath the gate trace.

20. A device as in claim 19, further comprising:
   a) a radiation detector electrically attached to the JFET;
   b) an hermetically sealed container surrounding the radiation detector and JFET; and
   c) a widow in the container configured to allow x-rays to pass into the container and impinge upon the radiation detector.

* * * * *